(12) United States Patent
Li et al.

(10) Patent No.: US 12,519,028 B2
(45) Date of Patent: Jan. 6, 2026

(54) PACKAGE STRUCTURE INCLUDING A SIDE HEAT DISSIPATOR AND METHOD FOR MANUFACTURING THE PACKAGE STRUCTURE

(71) Applicant: SAMSUNG ELECTRONICS CO., LTD., Suwon-si (KR)

(72) Inventors: Ying Li, Suzhou (CN); Longhao Piao, Suzhou (CN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 566 days.

(21) Appl. No.: 17/959,580

(22) Filed: Oct. 4, 2022

(65) Prior Publication Data

US 2023/0253285 A1    Aug. 10, 2023

(30) Foreign Application Priority Data

Feb. 10, 2022    (CN) .......................... 202210123951.2

(51) Int. Cl.
*H01L 23/367*    (2006.01)
*H01L 21/48*    (2006.01)
(Continued)

(52) U.S. Cl.
CPC ...... *H01L 23/3675* (2013.01); *H01L 21/4882* (2013.01); *H01L 21/563* (2013.01); *H01L 23/3677* (2013.01); *H01L 24/11* (2013.01); *H01L 24/16* (2013.01); *H01L 24/32* (2013.01); *H01L 24/73* (2013.01); *H01L 23/552* (2013.01); *H01L 2224/119* (2013.01); *H01L 2224/16225* (2013.01); *H01L 2224/32225* (2013.01); *H01L 2224/73204* (2013.01); *H01L 2924/1616* (2013.01); *H01L 2924/16195* (2013.01);
(Continued)

(58) Field of Classification Search
CPC ............... H01L 23/367; H01L 23/3675; H01L 23/3677; H01L 23/562; H01L 21/4882; H01L 21/50; H01L 21/52; H01L 21/563; H01L 24/32; H01L 24/13; H01L 24/16; H01L 24/36; H01L 24/73
See application file for complete search history.

(56) References Cited

U.S. PATENT DOCUMENTS 7,928,590 B2    4/2011  Wolter et al.
8,970,044 B2    3/2015  Choi et al.
(Continued)

FOREIGN PATENT DOCUMENTS

CN    106057747 A    10/2016
CN    210640228 U    5/2020
(Continued)

OTHER PUBLICATIONS

Communication issued Sep. 18, 2024 by the National Intellectual Property Administration of P.R. China in Chinese Patent Application No. 202210123951.2.

*Primary Examiner* — Khiem D Nguyen
(74) *Attorney, Agent, or Firm* — Sughrue Mion, PLLC

(57) ABSTRACT

Provided is a package structure, including a substrate, a chip on the substrate in a flip-chip manner, the chip including a circuit layer, and a side heat dissipator on a side of the chip, the side heat dissipator comprising a heat conduction material, wherein the side heat dissipator is electrically connected to the circuit layer.

18 Claims, 16 Drawing Sheets

(51) Int. Cl.
   *H01L 21/56*   (2006.01)
   *H01L 23/00*   (2006.01)
   *H01L 23/552*   (2006.01)

(52) U.S. Cl.
   CPC .............. *H01L 2924/16235* (2013.01); *H01L 2924/16251* (2013.01); *H01L 2924/16315* (2013.01); *H01L 2924/1632* (2013.01); *H01L 2924/3511* (2013.01); *H01L 2924/384* (2013.01)

(56) References Cited

U.S. PATENT DOCUMENTS

| | | | |
|---|---|---|---|
| 10,008,454 | B1 | 6/2018 | Ho |
| 11,031,347 | B2 | 6/2021 | Kim et al. |
| 11,183,466 | B2 | 11/2021 | Park |
| 11,374,136 | B2 * | 6/2022 | Tai ...................... H01L 23/3185 |
| 2005/0056928 | A1 * | 3/2005 | Kwon .................... H01L 23/36 |
| | | | 257/E23.101 |
| 2008/0093733 | A1 | 4/2008 | Hsu |
| 2013/0208426 | A1 | 8/2013 | Kim et al. |
| 2014/0300004 | A1 * | 10/2014 | Choi ...................... H01L 21/561 |
| | | | 257/774 |
| 2018/0350755 | A1 * | 12/2018 | Huang ................ H01L 23/3128 |
| 2020/0185330 | A1 * | 6/2020 | Yu ........................... H01L 24/24 |
| 2021/0111094 | A1 * | 4/2021 | Kim ..................... H01L 23/3677 |
| 2021/0118767 | A1 | 4/2021 | Chi et al. |
| 2022/0020659 | A1 | 1/2022 | Zheng et al. |
| 2022/0165722 | A1 * | 5/2022 | Park ........................ H01L 25/50 |

FOREIGN PATENT DOCUMENTS

| | | |
|---|---|---|
| CN | 111574967 A | 8/2020 |
| CN | 112447635 A | 3/2021 |
| CN | 112542427 A | 3/2021 |
| CN | 112670187 A | 4/2021 |
| CN | 113454774 A | 9/2021 |
| JP | 2001-7255 A | 1/2001 |
| TW | 200820401 A | 5/2008 |
| WO | 2021/119930 A1 | 6/2021 |

* cited by examiner

PACKAGE STRUCTURE INCLUDING A SIDE HEAT DISSIPATOR AND METHOD FOR MANUFACTURING THE PACKAGE STRUCTURE

CROSS-REFERENCE TO RELATED APPLICATION

This application claims priority to Chinese Patent Application No. 202210123951.2 filed in the China National Intellectual Property Administration on Feb. 10, 2022, disclosure of which is incorporated by reference herein in its entirety.

BACKGROUND

1. Field

Embodiments of the present disclosure relate to a field of semiconductor package, and in particular, to a side-heat-dissipation-enhanced package structure and a method for manufacturing the same.

2. Description of Related Art

Heat generated by power consumption of a chip may increase a temperature of the chip, which will affect performance of the chip and even cause irreversible damage to the chip. Research on power consumption relates to all aspects of chip production, and energy consumption ratio of the chip has also been improving with improvements of design and process. However, requirement for the performance of the chip is still increasing, such that the improvement of the power consumption ratio cannot solve heat dissipation issue caused by the power consumption of the chip. The heat dissipation issue is more significant in advanced chips such as central processing unit (CPU), graphics processing unit (GPU), and the like. With development of manufacturing processes, there are more and more transistors in a chip, and the power consumption of the chip becomes increasingly higher.

Semiconductor package not only physically protects the chip, but also helps the chip to dissipate heat. FIG. 1 shows a package structure 9 in the related art. As shown in FIG. 1, the package structure 9 includes a substrate 910, and a chip 920, a heat conduction layer 930 and a heat dissipation cover 940, which are sequentially disposed on the substrate 910. The package structure 9 further includes an underfill 950. The chip 920 is connected to the substrate 910 by solder balls 925 in a flip-chip manner. The heat conduction layer 930 is in direct contact with an upper surface of the chip 920. The heat dissipation cover 940 includes a cover portion 941 and a wall portion 942. A central part of the cover portion 941 is in direct contact with an upper surface of the heat conduction layer 930. The wall portion 942 extends downward from a peripheral part of the cover portion 941 and is adhered to the substrate 910 by an adhesive 945. The underfill 950 is disposed between the chip 920 and the substrate 910. The package structure 9 is connected externally by solder balls 915 disposed under the substrate 910.

The power consumption is concentrated at a circuit layer (or a functional area) of the chip. Referring to FIG. 1, the power consumption is concentrated at a lower portion of the chip 920, such that the lower portion of the chip 920 acts as a heat source. The package structure 9 helps the heat source to dissipate heat in a vertically upward direction. During the heat dissipation, heat from the lower portion of the chip 920 sequentially passes through an upper portion (silicon) of the chip 920, the heat conduction layer 930 and the heat dissipation cover 940, and finally enters an external environment (air).

However, silicon has a very low coefficient of thermal conductivity, only being 0.21 W/m·K. As a base material of the chip, it is very difficult to replace silicon with another material, which greatly limits heat dissipation efficiency. The chip may be thinned after the chip has been formed, thereby reducing a thickness of the silicon and improving the heat dissipation efficiency. However, chips with high power consumptions generally have a large chip size. The chip will become lighter after being thinned, which will lead to a more serious warpage issue of the chip and even lead to a pseudo soldering issue.

SUMMARY

One or more example embodiments are directed to a side-heat-dissipation-enhanced package structure and a method for manufacturing the same.

One or more example embodiments are directed to a package structure, which may include a substrate, a chip which may be mounted on the substrate in a flip-chip manner, and a side heat dissipator which may include a heat conduction material and be disposed on a side of the chip, wherein the side heat dissipator may be electrically connected to a circuit layer of the chip.

According to an aspect of an example embodiment, there is provided a package structure, including a substrate, a chip on the substrate in a flip-chip manner, the chip including a circuit layer, and a side heat dissipator on a side of the chip, the side heat dissipator comprising a heat conduction material, wherein the side heat dissipator is electrically connected to the circuit layer.

According to another aspect of an example embodiment, there is provided a method for manufacturing a package structure, including forming a side heat dissipator on a side of a chip, the side heat dissipator comprising a heat conduction material, and mounting the chip on a substrate in a flip-chip manner, wherein the side heat dissipator is electrically connected to a circuit layer of the chip.

According to another aspect of an example embodiment, there is provided a package structure, including a substrate, a chip on the substrate in a flip-chip manner, the chip including a circuit layer, a side heat dissipator on a side of the chip, the side heat dissipator including a heat conduction material, a side heat conduction layer between the side of the chip and the side heat dissipator, the side heat conductor layer including a thermal interface material, an upper heat conduction layer in contact with the upper surface of the chip, and a heat dissipation cover in contact with an upper surface of the upper heat conduction layer, wherein the side heat dissipator is electrically connected to the circuit layer.

BRIEF DESCRIPTION OF DRAWINGS

The above and other objects and features of the present disclosure will become apparent by describing in detail embodiments thereof with reference to the accompanying drawings.

DETAILED DESCRIPTION

Hereinafter, example embodiments will be described more fully with reference to the accompanying drawings. Those skilled in the art would appreciate that the example embodiments may be modified in various different ways, all without departing from the spirit or scope of the present disclosure. Irrelevant parts will be omitted to clearly describe the present disclosure.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
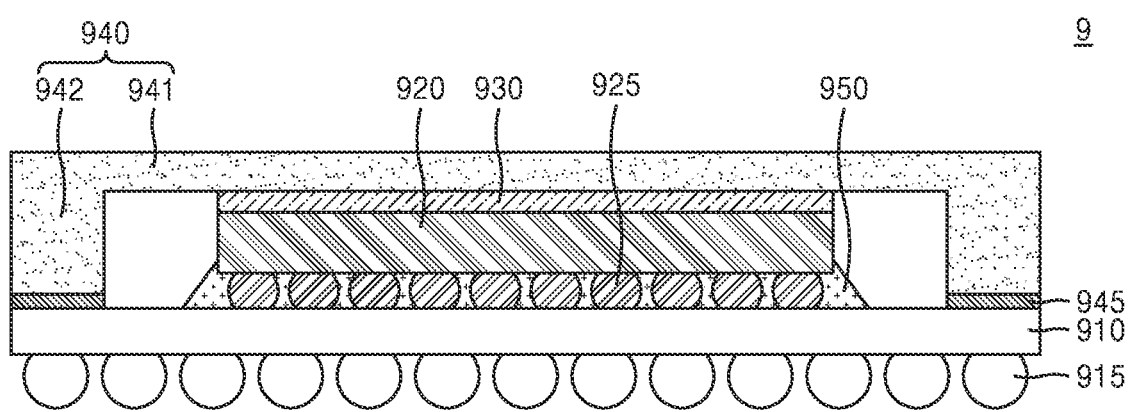
FIG. 1 shows a package structure in the related art.
Figure 2:
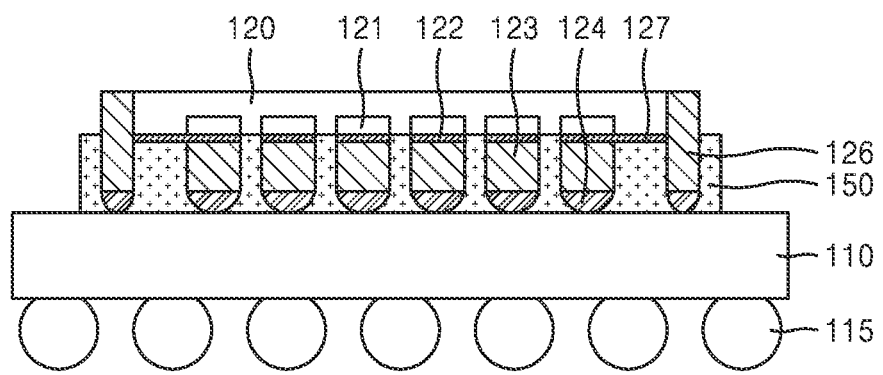
FIG. 2 is a cross-sectional view illustrating a package structure according to an example embodiment.

FIG. 2 is a cross-sectional view illustrating a package structure 1 according to an example embodiment.

The package structure 1 may include a substrate 110 and a chip 120 disposed on the substrate 110 in a flip-chip manner. The substrate 110 may include ceramic, glass, plastic, and/or other substrate materials. For example, the substrate 110 may include bismaleimide triazine (BT) resin. A side of the chip 120 that is electrically connected externally may be a front side. In FIG. 2, the front side of the chip 120 corresponds to a lower surface of the chip 120. The chip 120 has a circuit layer which may be disposed near the front side of the chip 120, for example, the circuit layer of the chip 120 may be disposed at a lower portion of the chip 120. Chip pads 121 may be disposed at the lower surface of the chip 120. The chip 120 (or the chip pads 121) may be electrically connected to connection pads, wirings, vias, circuits, and/or the like disposed at an upper surface of the substrate 110 and/or within the substrate 110 through connectors, and/or may be electrically connected externally through solder balls 115 disposed under the substrate 110.

The connectors may include under bump metals (UBMs) 122, bumps 123, and solder balls 124, which are sequentially arranged in a downward direction. The UBM 122 can enhance the connection. The UBM 122 may include a single-layer structure or a multi-layer structure of metal. For example, the UBM 122 may include a double-layer structure of titanium/copper (Ti/Cu). The bump 123 may serve as body of the connector. The bump 123 may include a metal or an alloy thereof. For example, the bump 123 may include a metal such as copper. The solder ball 124 may include a common solder. For example, the solder ball 124 may include gold (Au), silver (Ag), copper (Cu), tin (Sn), and the like and/or an alloy thereof. In an embodiment, the connector may adopt controlled collapsed chip connection (C4) and/or circuit under pad (CuP). However, the connector is not limited thereto as long as the chip 120 can be electrically connected to the substrate 110 and/or connected externally via the connector.

The package structure 1 may further include a side heat dissipator 126 disposed on sides of the chip 120. The side heat dissipator 126 may be in direct contact with the sides of the chip 120. An upper surface of the side heat dissipator 126 may be substantially coplanar with the upper surface of the chip 120. The side heat dissipator 126 may include a heat conduction material. The side heat dissipator 126 may include a metal or an alloy thereof. For example, the side heat dissipator 126 may include a metal such as gold (Au), silver (Ag), copper (Cu), iron (Fe), aluminum (Al), and the like or an alloy thereof. However, material of the side heat dissipator 126 is not limited thereto as long as the side heat dissipator 126 can help the chip 120 to dissipate heat. The side heat dissipator 126 may include a same material as at least a portion of the connector. For example, in a case where the connector includes the bumps 123, the side heat dissipator 126 may include a same material as the bumps 123. However, embodiments are not limited thereto, and the side heat dissipator 126 may include a different material than any portion of the connector.

The side heat dissipator 126 may be disposed around the chip 120 in a shape of closed rectangular ring. For example, the side heat dissipator 126 may be disposed adjacent to the chip 120. However, embodiments are not limited thereto, and the side heat dissipator 126 may be disposed in a shape of open rectangular ring, and the side heat dissipator 126 may be disposed on one side, two sides or three sides of the chip 120.

The side heat dissipator 126 may increase strength and weight of the chip 120. Therefore, even if the chip 120 is thinned, warpage of the chip 120 may be reduced to prevented, thus reducing a risk of pseudo soldering of the chip 120 during a reflow process. As such, a thickness of the chip 120 may be reduced, so that a heat dissipation distance in the vertical direction may be shortened.

In addition, according to thinning/warping degree of the chip 120, the shape and thickness of the side heat dissipator 126 can be adjusted accordingly. For example, when thinning/warping degree of the chip 120 increases, a lateral thickness of the side heat dissipator 126 may increase and/or the side heat dissipator 126 may have the shape of a closed rectangular ring. When thinning/warping degree of the chip 120 is reduced, the side heat dissipator 126 may have a reduced lateral thickness and/or a shape other than the closed rectangular ring.

The connection portion 127 can connect the side heat dissipator 126 and the circuit layer of the chip 120. For example, the connection portion 127 may be provided on a lower surface of the chip 120 and connect the side heat dissipator 126 and the connector. The connection portion 127 may include a conductive material such as metal. The connecting portion 127 may include a same material as at least a portion of the connector. For example, in a case where the connector includes the UBMs 122, the connector 127 may include a same material and be in a same layer as the UBMs 122. However, the example embodiment is not limited thereto, and the connecting portion 127 may include a different material from any portion of the connector. The connection portion 127 may serve as a connection wiring.

The heat of heat source (i.e., the circuit layer of the chip 120) may be transferred to the side heat dissipator 126 without the connection portion 127. However, a heat transfer path at this time includes non-metal such as silicon base of the chip, and the heat transfer efficiency may be relatively low. In a case where the connecting portion 127 connects the side heat dissipator 126 and the circuit layer of the chip 120, the heat of the heat source may be transferred to the side of the chip 120 through heat conduction (e.g., metal heat conduction), and the heat transfer efficiency may be significantly improved. Therefore, a heat dissipation effect of the package structure 1 may be further improved.

The side heat dissipator 126 may directly contact the substrate 110. However, embodiments are not limited thereto. The solder balls 124 may be formed between the side heat dissipator 126 and the substrate 110. The side heat dissipator 126 may be electrically insulated from the substrate 110. However, embodiments are not limited thereto. The side heat dissipator 126 may be directly electrically connected to, or electrically connected to, by the solder ball 124 or by the connection portion 127 and the connector connected thereto, connection pads, wirings, vias, circuits, and/or the like disposed at an upper surface of the substrate 110 and/or within the substrate 110, and/or may be electrically connected externally by the solder balls 115 disposed under the substrate 110.

The side heat dissipator 126 may connect to or transmit a signal. The side heat dissipator 126 may connect to or transmit the signal through the substrate 110.

The side heat dissipator 126 may connect to or transmit a chip signal, which is a signal related to an operation of the chip. In general, the greater the signal current is, the more heat an associated portion of the heat source generates. Thus, the side heat dissipator 126 may connect to or transmit the chip signal with greater (e.g., greatest) current. For example, the side heat dissipator 126 may connect to or transmit the chip signal with the greatest current, at least one of the chip signals with top-three-greatest current, at least one of the chip signals with top-five-greatest current, or at least one of the chip signals with top-ten-greatest current. However, embodiments are not limited thereto.

The side heat dissipator 126 may not connect to or transmit a signal. The side heat dissipator 126 may connect to or transmit a dummy signal. In this case, the side heat dissipator 126 may serve as an electromagnetic shield.

The package structure 1 may further include a filler 150 disposed between the substrate 110 and the chip 120. The filler 150 may include an underfill (UF), a non-conductive paste (NCP), and/or a non-condutive film (NCF). The underfill may include epoxy resin. For example, the filler 150 may fill unoccupied space between the chip 120 and the substrate 110.

FIGS. 3 to 12 are cross-sectional views illustrating a method of manufacturing a package structure according to an example embodiment.

Figure 3:
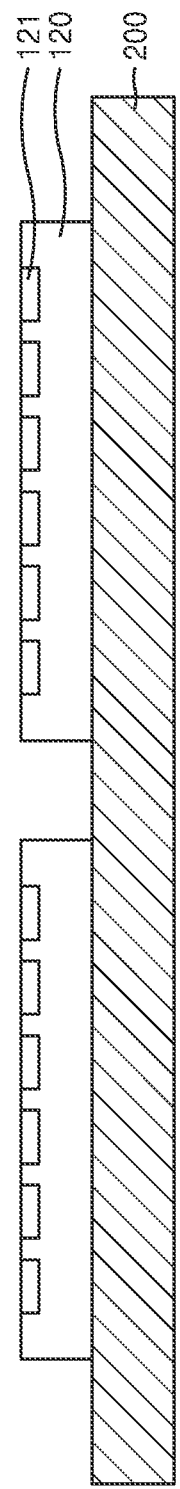
FIGS. 3, 4, 5, 6, 7, 8, 9, 10, 11, and 12 are cross-sectional views illustrating a method of manufacturing a package structure according to an example embodiment.

Referring to FIG. 3, first, wafer reconstitution may be performed. A chip 120 may be disposed on a reconstitution substrate 200. A front side of the chip 120, at which chip pads 121 are disposed, may be upward, facing away from the reconstitution substrate 200.

Figure 4:
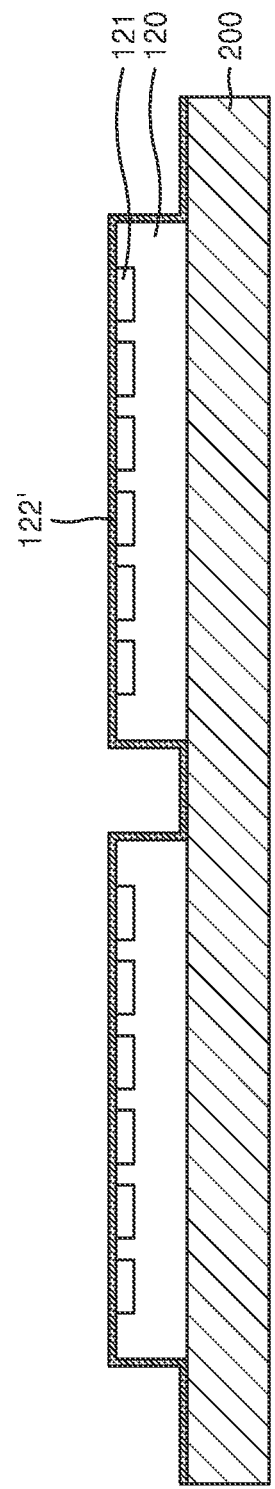

Referring to FIG. 4, an under bump metal layer (UBM layer) 122' may be formed on the reconstitution substrate 200 and the chip 120. For example, the UBM layer 122' may be formed on and cover an upper surface of the chip 120. The UBM layer 122' may also be formed on and cover at least one of a side of the chip 120 and an exposed upper surface of the reconstitution substrate 200. The UBM layer 122' may be formed by various deposition methods such as, for example, sputtering. The UBM layer 122' may include a single-layer structure or a multi-layer structure of metal. For example, the UBM layer 122' may include a double-layer structure of Ti/Cu.

Figure 5:
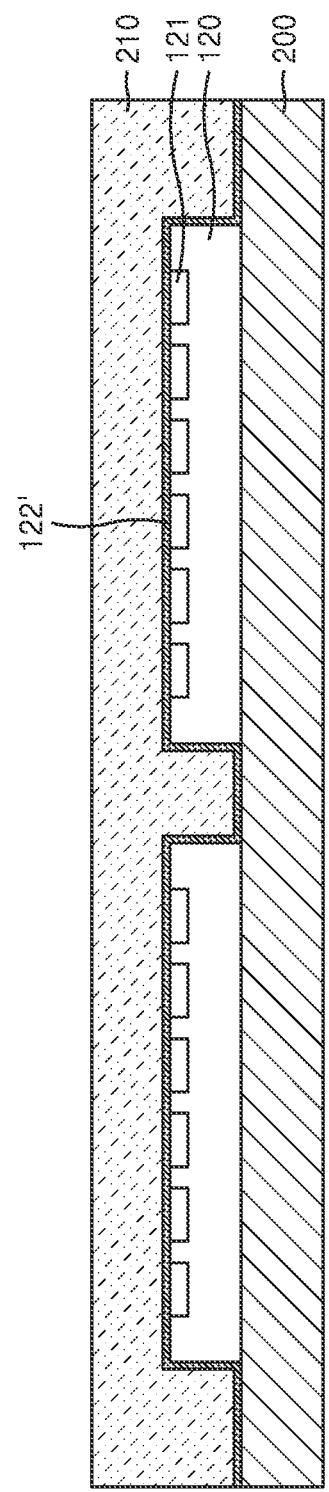
Figure 6:
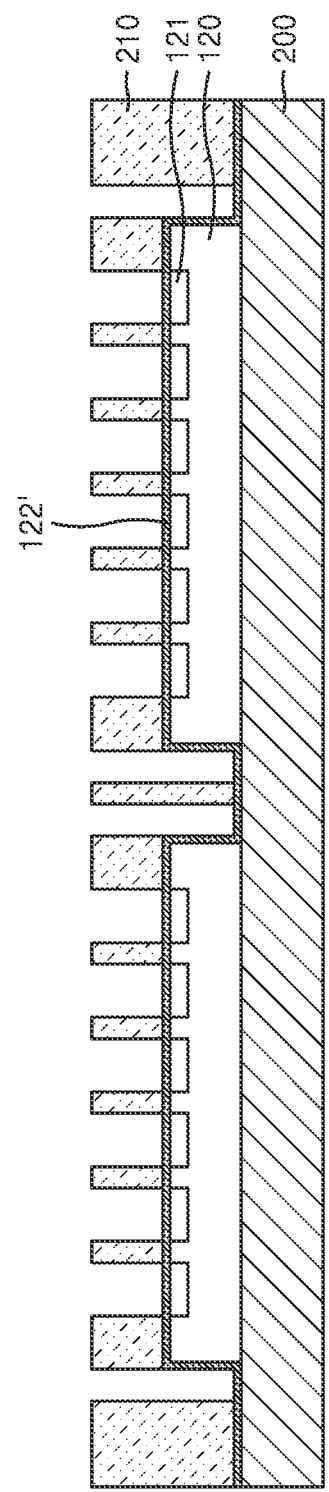

Referring to FIGS. 5 and 6, a photoresist 210 may be formed on the UBM layer 122', and the photoresist 210 may be patterned, for example, exposed and developed. The patterned photoresist 210 may be formed with first holes overlapping the chip pads 121. The patterned photoresist 210 may also be formed with second holes exposing the side of the chip 120 or a portion of the UBM layer 122' formed on the side of the chip 120 in a lateral direction.

Figure 7:
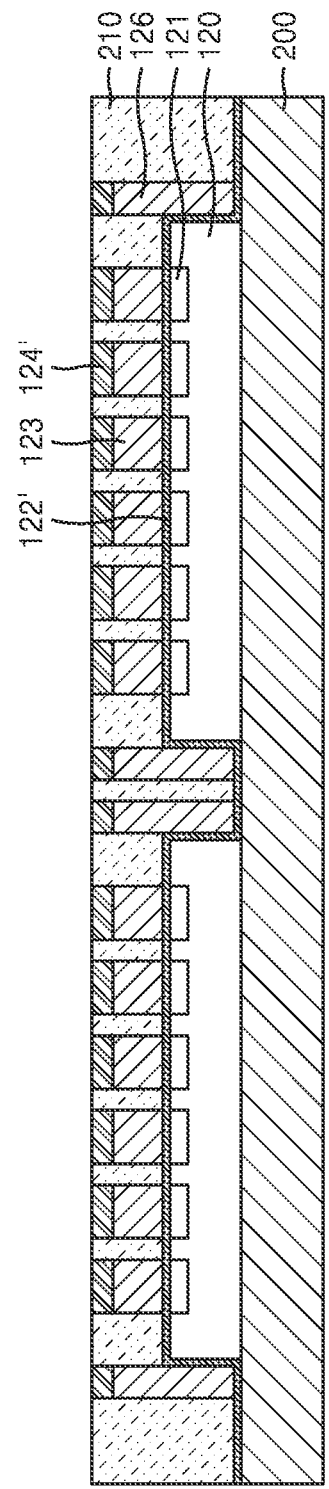

Referring to FIG. 7, bumps 123 may be formed in the first holes and a side heat dissipator 126 may be formed in the second holes. Then, solders 124' may be formed in remaining portions of the first and second holes. The bumps 123, the side heat dissipator 126, and the solders 124' may be formed by various methods such as, for example, plating. However, embodiments are not limited thereto. The solders 124' may not be formed. The bumps 123 and the side heat dissipator 126 may partially or fully fill the first and second holes without the solders 124'.

Figure 8:
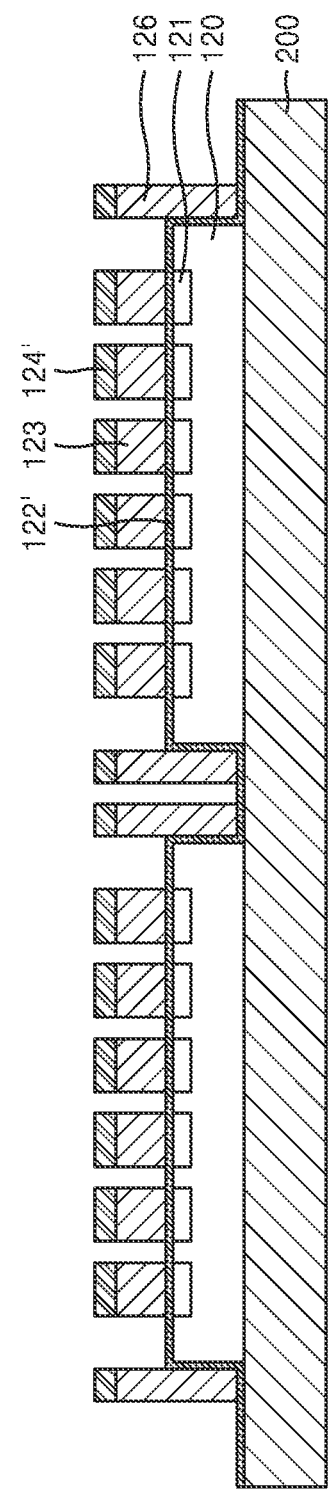

Referring to FIG. 8, the patterned photoresist 210 may be removed, for example, stripped).

Figure 9:
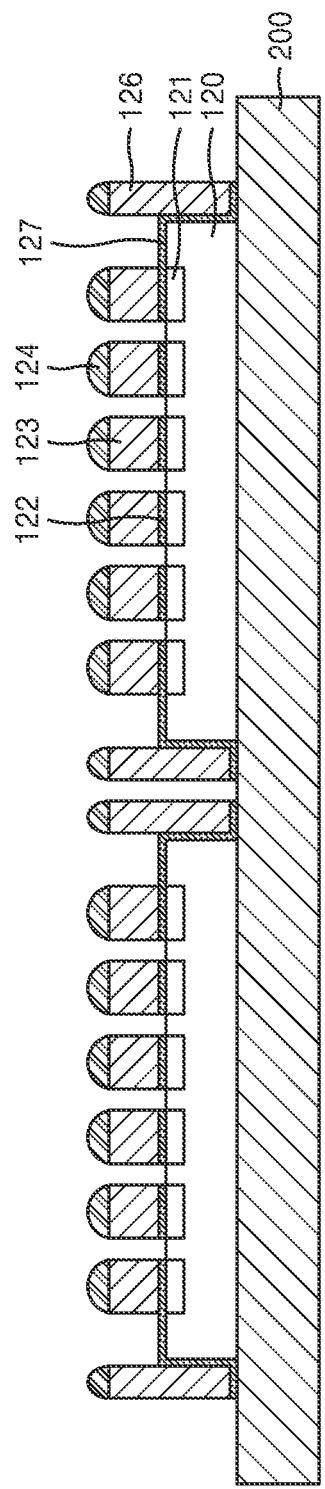

Referring to FIG. 9, the solders 124' may be heated for reflow such that the solders 124' are formed into solder balls 124 having curved upper surfaces. In addition, the UBM layer 122' may be patterned. For example, the UBM layer 122' may be etched. The patterned UBM layer 122' may include UBMs 122 between the chip 120 (e.g., the chip pads 121) and the bumps 123. The patterned UBM layer 122' may further include connection portions 127 between the connectors (the UBM 122, the bump 123, and the solder ball 124) and the side heat dissipator 126. In a case where the UBM layer 122' covers the side of the chip 120 and/or the exposed upper surface of the reconstitution substrate 200, the patterned UBM layer 122 may further include portions between the side of the chip 120 and the side heat dissipator 126 and/or portions between the side heat dissipator 126 and the reconstitution substrate 200.

Figure 10:
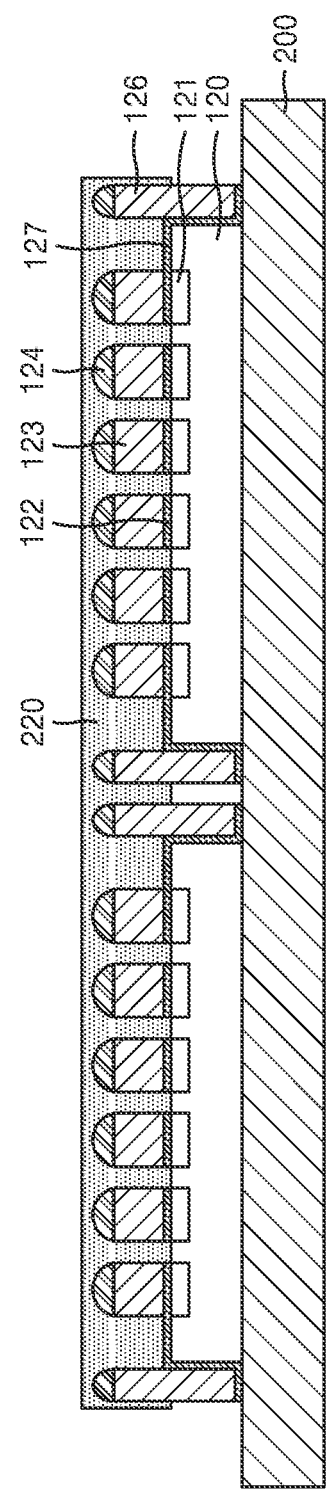

Referring to FIG. 10, a thinning support 220 may be disposed on the chip 120. For example, the thinning support 220 may be disposed using lamination or other suitable process. The thinning support 220 fills gaps between the connectors (the UBM 122, the bump 123, and the solder ball 124) and gaps between the connectors (the UBM 122, the bump 123, and the solder ball 124) and the side heat dissipator 126.

Figure 11:
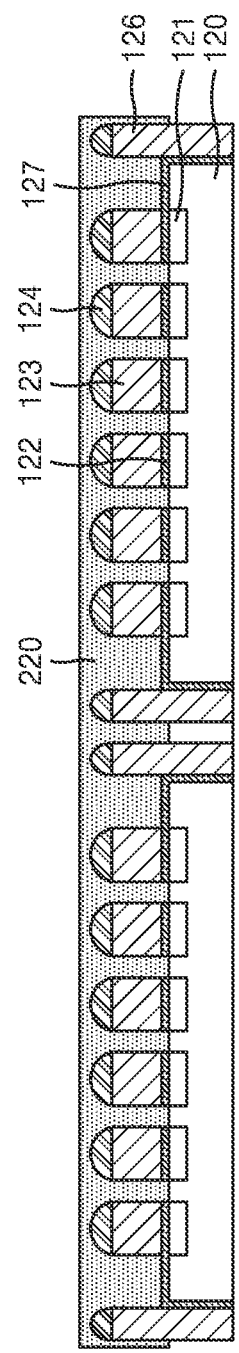

Referring to FIG. 11, the reconstitution substrate 200 may be removed. Then, the chip 120 may be thinned. The thinning support 220 may support a process of removing the reconstitution substrate 200 and thinning the chip 120. For example, the chip 120 may be thinned by back grinding, and in this case, the thinning support 220 may be a back grinding tape. The back side of the chip 120 and the side heat dissipator 126 may be thinned at the same time. After being thinned, a thinned surface (lower surface) of the side heat dissipator 126 may be substantially coplanar with a thinned surface (lower surface) of the chip 120. In a case where the patterned UBM layer 122' includes a portion on the side of the chip 120, a thinned surface of the portion of the patterned UBM layer 122' may also be substantially aligned with the thinned surface of the chip 120. In a case where the patterned UBM layer 122' includes a portion between the side heat dissipator 126 and the reconstitution substrate 200, the portion of the patterned UBM layer 122' may be removed after being thinned. As the presence of the side heat dissipator 126 may increase a strength of the chip 120, the chip 120 may be thinned to a greater extent than a case where the side heat dissipator 126 is not provided.

Figure 12:
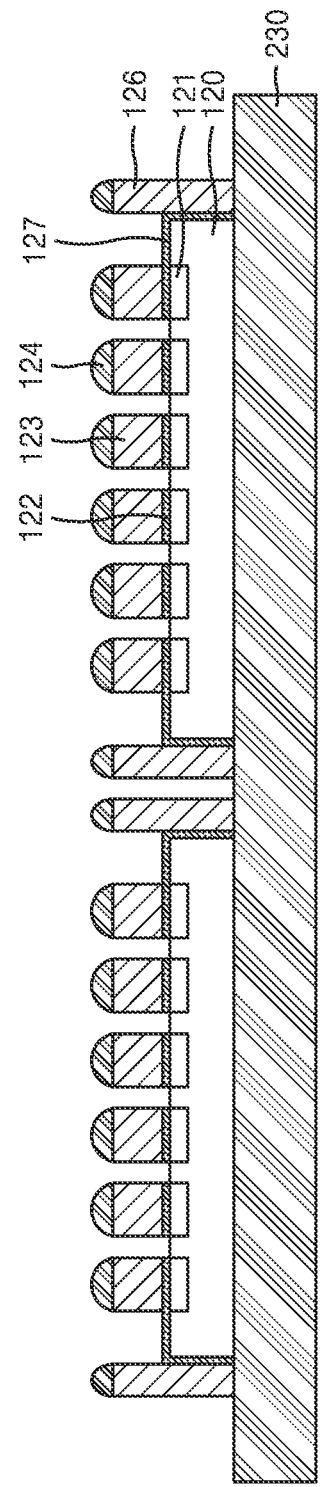

Referring to FIG. 12, a dicing tape 230 may be disposed on the thinned surfaces of the chip 120 and the side heat dissipator 126. Then, the thinning support 220 may be removed.

Referring to FIGS. 2 and 12, a dicing process may be performed, thereby forming a single chip 120. Then, the chip 120 may be mounted on the substrate 110 in a flip-chip manner, and the dicing tape 230 may be removed, thereby forming the package structure 1 of FIG. 2. In FIG. 2, the side heat dissipator 126 is in direct contact with the side of the chip 120. For example, FIG. 2 corresponds to an embodiment in which the UBM layer 122' of FIG. 4 does not cover the chip 120. However, embodiments are not limited thereto, and the package structure may include a portion of the patterned UBM layer 122' disposed between the side of the chip 120 and the side heat dissipator 126.

However, embodiments are not limited thereto. The above method of FIGS. 3 to 12 describes forming of a side heat dissipator including a heat conduction material on a side of a chip as an example, and the above method may be appropriately adjusted or other suitable methods may be used to form a side heat dissipator on a side of a chip.

Figure 13:
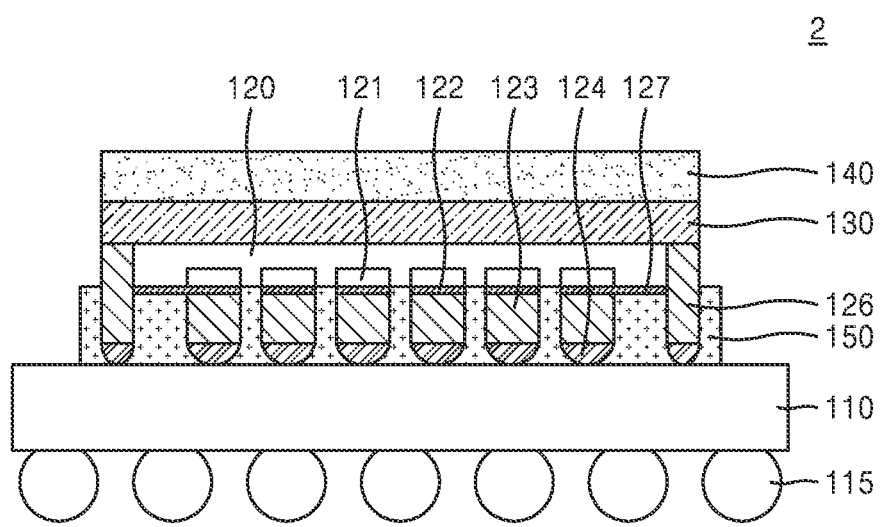
FIGS. 13, 14, 15, and 16 are cross-sectional views illustrating package structures according to example embodiments.

FIG. 13 is a cross-sectional view illustrating a package structure 2 according to an example embodiment.

A difference between the package structure 2 in FIG. 13 and the package structure 1 in FIG. 2 is that the package structure 2 may further include an upper heat conduction layer 130 and a heat dissipation cover 140 which are sequentially disposed on the chip 120. The upper heat conduction layer 130 may include a thermal interface material (TIM). The thermal interface material may include heat conduction silicone, (phase change type) heat conduction adhesive, a heat conduction gel, a metal thermal interface material, or the like. The metal thermal interface material may include indium. The heat dissipation cover 140 may include a heat conduction material, which may include a metal such as gold (Au), silver (Ag), copper (Cu), iron (Fe), aluminum (Al), and the like or an alloy thereof. Each of the upper heat conduction layer 130 and the heat dissipation cover 140 may have a substantially flat plate shape. Sides of the upper heat conduction layer 130 and the heat dissipation cover 140 may be substantially aligned with the sides of the side heat dissipator 126, but embodiments are not limited thereto. The side of at least one of the upper heat conduction layer 130 and the heat dissipation cover 140 may be outside or inside the side of the side heat dissipator 126. The side of at least one of the upper heat conduction layer 130 and the heat dissipation cover 140 may be substantially aligned with the side of the chip 120. The side of at least one of the upper heat conduction layer 130 and the heat dissipation cover 140 may be outside or inside the side of the chip 120.

In the package structure 2, heat from the heat source may enter an external environment (air) through the upper portion (e.g., silicon) of the chip 120, the upper heat conduction layer 130 and the heat dissipation cover 140 in sequence from the lower portion of the chip 120. In addition, in a case where the upper heat conduction layer 130 is in direct contact with the side heat dissipator 126, for example, in a case where the side of the upper heat conduction layer 130 is outside the side of the chip 120, the heat transferred from the chip 120 to the side heat dissipator 126 may also be transferred to the upper heat conduction layer 130 and the heat dissipation cover 140 to enter the external environment (air).

Therefore, with regard to the package structures 1 and 2, the package structure 1 may be lighter and thinner, while the package structure 2 may have a better heat dissipation effect.

Figure 14:
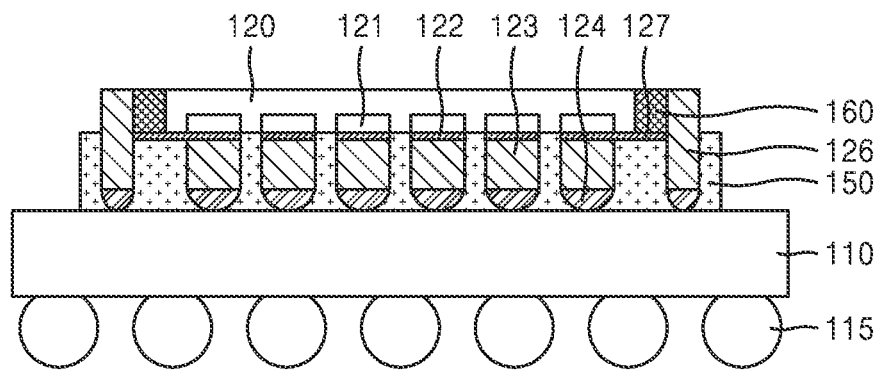

FIG. 14 is a cross-sectional view illustrating a package structure 3 according to an example embodiment.

A difference between the package structure 3 and the package structure 1 is that the package structure 3 may further include a side heat conduction layer 160 disposed between the side of the chip 120 and the side heat dissipator 126. An upper surface of the side heat conduction layer 160 may be substantially coplanar with the upper surface of the chip 120 and the upper surface of the side heat dissipator 126.

The side heat conduction layer 160 may include a thermal interface material. The thermal interface material may include a heat conduction silicone, a (phase change type) heat conduction adhesive, a heat conduction gel, a metal thermal interface material, or the like. The metal thermal interface material may include indium.

The side heat conduction layer 160 may facilitate transferring heat from the side of the chip 120 to the side heat dissipator 126.

Figure 15:
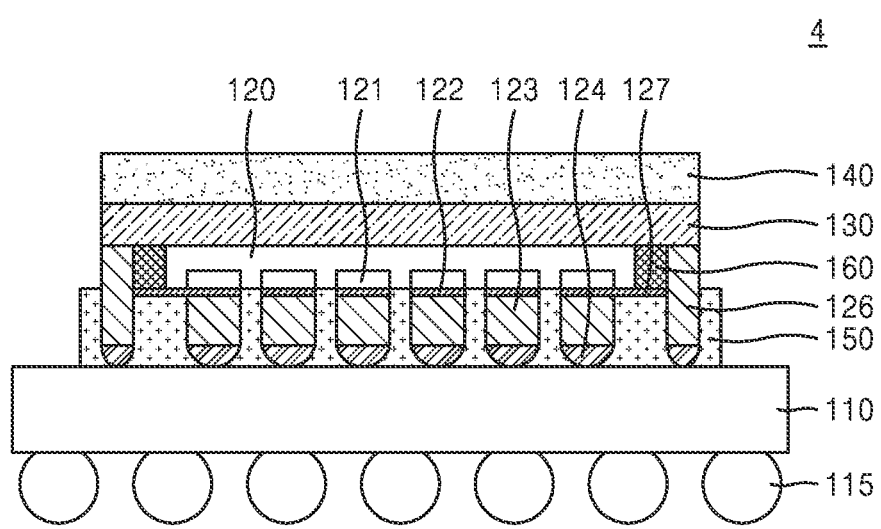

FIG. 15 is a cross-sectional view illustrating a package structure 4 according to an example embodiment.

A difference between the package structure 4 and the package structure 3 is that the package structure 4 may further include an upper heat conduction layer 130 and a heat dissipation cover 140 which are sequentially disposed on the chip 120. The upper heat conduction layer 130 and the heat dissipation cover 140 of the package structure 4 may be substantially the same as the upper heat conduction layer 130 and the heat dissipation cover 140 of the package structure 2, respectively.

Figure 16:
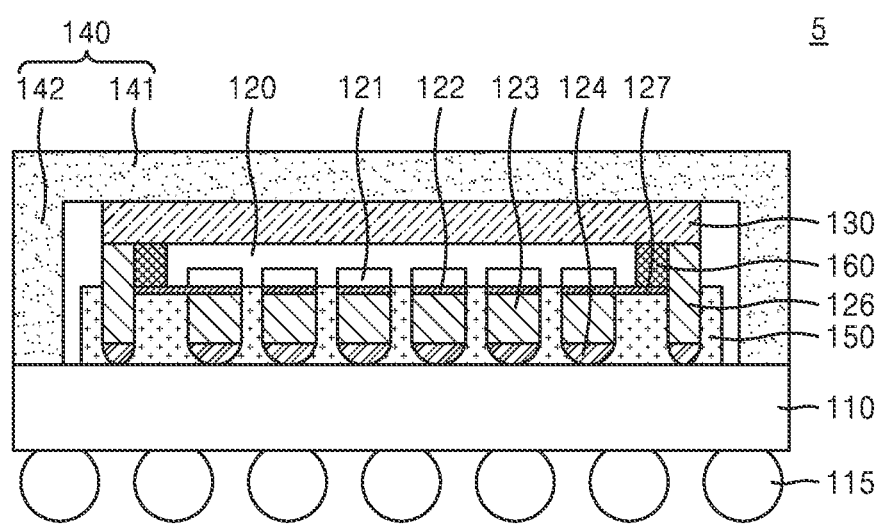

FIG. 16 is a cross-sectional view illustrating a package structure 5 according to an example embodiment.

A difference between the package structure 5 and the package structure 4 is that the heat dissipation cover 140 of the package structure 5 may include a cover portion 141 and a wall portion 142. The cover portion 141 may have a substantially flat plate shape. A central part of the cover portion 141 is in direct contact with the upper surface of the upper heat conduction layer 130. The wall portion 142 extends downward from the peripheral part of the cover portion 141. The wall portion 142 may be adhered to the substrate 110 by an adhesive.

While the present disclosure has been described with reference to example embodiments thereof, it will be apparent to those of ordinary skill in the art that various changes and modifications may be made thereto without departing from the spirit and scope of the present disclosure as set forth in the following claims and their equivalents.

What is claimed is:

1. A package structure, comprising:
    a substrate;
    a chip on the substrate in a flip-chip manner, the chip comprising a circuit layer;
    a side heat dissipator on a side of the chip, the side heat dissipator comprising a heat conduction material;
    a plurality of connectors between the chip and the substrate and configured to electrically connect the circuit layer included in the chip and the substrate; and
    a connection portion on a lower surface of the chip facing the substrate and between a connector of the plurality of connectors and the side heat dissipator, the connection portion being configured to electrically connect the connector with the side heat dissipator,
    wherein the side heat dissipator is electrically connected to the circuit layer.

2. The package structure of claim 1, further comprising:
    a side heat conduction layer comprising a thermal interface material and between the side of the chip and the side heat dissipator, the side heat conduction layer directly contacting at least one of the chip and the side heat dissipator,
    wherein an upper surface of the side heat conduction layer, an upper surface of the chip and an upper surface of the side heat dissipator are coplanar.

3. The package structure of claim 1, further comprising:
an upper heat conduction layer in contact with an upper surface of the chip; and
a heat dissipation cover in contact with an upper surface of the upper heat conduction layer,
wherein the upper heat conduction layer comprises a thermal interface material,
wherein the heat dissipation cover comprises a heat conduction material,
wherein at least one of the upper heat conduction layer and the heat dissipation cover has a flat plate shape.

4. The package structure of claim 3, wherein the heat dissipation cover comprises a cover portion having a flat plate shape and a wall portion extending downward from a peripheral part of the cover portion, a central part of the cover portion being in direct contact with the upper surface of the upper heat conduction layer.

5. The package structure of claim 1, wherein each of the plurality of connectors comprises an under bump metal, a bump and a solder ball disposed in sequence from the chip toward the substrate,
wherein the side heat dissipator comprises a material that is the same as a material of the bump, and
wherein the connection portion comprises a material that is the same as a material of the under bump metal, and is in a layer that is the same as a layer of the under bump metal.

6. The package structure of claim 1, wherein the side heat dissipator connects to a first signal, and
wherein the first signal is a chip signal or a dummy signal.

7. The package structure of claim 6, wherein the first signal is, among chip signals, the chip signal with the greatest current, at least one of the chip signals with top-three-greatest current, at least one of the chip signals with top-five-greatest current, or at least one of the chip signals with top-ten-greatest current.

8. The package structure of claim 1, further comprising:
a filler comprising at least one of an underfill, a non-conductive paste, and a non-conductive film and filling a space between the chip and the substrate.

9. A method for manufacturing a package structure, comprising:
forming a side heat dissipator on a side of a chip, the side heat dissipator comprising a heat conduction material;
mounting the chip on a substrate in a flip-chip manner, the chip comprising a circuit layer;
forming a plurality of connectors between the chip and the substrate, the plurality of connectors being configured to electrically connect the circuit layer included in the chip and the substrate; and
forming a connection portion on a lower surface of the chip facing the substrate and between a connector of the plurality of connectors and the side heat dissipator, the connection portion being configured to electrically connect the connector with the side heat dissipator,
wherein the side heat dissipator is electrically connected to the circuit layer of the chip.

10. The method of claim 9, further comprising:
forming a side heat conduction layer, comprising a thermal interface material, between the side of the chip and the side heat dissipator, the side heat conduction layer directly contacting at least one of the chip and the side heat dissipator,
wherein an upper surface of the side heat conduction layer, an upper surface of the chip and an upper surface of the side heat dissipator are coplanar.

11. The method of claim 9, further comprising:
forming an upper heat conduction layer on an upper surface of the chip; and
forming a heat dissipation cover on an upper surface of the upper heat conduction layer,
wherein the upper heat conduction layer comprises a thermal interface material,
wherein the heat dissipation cover comprises a heat conduction material,
wherein at least one of the upper heat conduction layer and the heat dissipation cover has a flat plate shape.

12. The method of claim 11, wherein forming the heat dissipation cover comprises forming a cover portion having a flat plate shape and a wall portion extending downward from a peripheral part of the cover portion, a central part of the cover portion being in direct contact with the upper surface of the upper heat conduction layer.

13. The method of claim 9, wherein forming the plurality of connectors comprises forming an under bump metal, a bump and a solder ball in sequence from the chip toward the substrate,
wherein the side heat dissipator comprises a material that is the same as a material of the bump, and
wherein the connection portion comprises a material that is the same as a material of the under bump metal, and is in a layer that is the same as a layer of the under bump metal.

14. The method of claim 9, wherein the side heat dissipator connects to a first signal, and
wherein the first signal is a chip signal or a dummy signal.

15. The method of claim 14, wherein the first signal is, among chip signals, the chip signal with the greatest current, at least one of the chip signals with top-three-greatest current, at least one of the chip signals with top-five-greatest current, or at least one of the chip signals with top-ten-greatest current.

16. The method of claim 9, further comprising:
forming a filler comprising at least one of an underfill, a non-conductive paste, and a non-conductive film and filling a space between the chip and the substrate.

17. A package structure, comprising:
a substrate;
a chip on the substrate in a flip-chip manner, the chip comprising a circuit layer;
a side heat dissipator on a side of the chip, the side heat dissipator comprising a heat conduction material;
a side heat conduction layer between the side of the chip and the side heat dissipator, the side heat conduction layer comprising a thermal interface material;
an upper heat conduction layer in contact with an upper surface of the chip;
a heat dissipation cover in contact with an upper surface of the upper heat conduction layer;
a plurality of connectors between the chip and the substrate and configured to electrically connect the circuit layer included in the chip and the substrate; and
a connection portion on a lower surface of the chip facing the substrate and between a connector of the plurality of connectors and the side heat dissipator, the connection portion being configured to electrically connect the connector with the side heat dissipator,
wherein the side heat dissipator is electrically connected to the circuit layer.

18. The package structure of claim 17, wherein the side heat conduction layer contacts at least one of the chip and the side heat dissipator.

* * * * *